（12）United States Patent
Knippelmeyer

(10) Patent No.: US 9,336,981 B2
(45) Date of Patent: May 10, 2016

(54) CHARGED PARTICLE DETECTION SYSTEM AND MULTI-BEAMLET INSPECTION SYSTEM

(75) Inventor: Rainer Knippelmeyer, Munich (DE)

(73) Assignees: APPLIED MATERIALS ISRAEL LTD., Rehovot (IL); CARL ZEISS MICROSCOPY GMBH, Jena (DE)

( * ) Notice: Subject to any disclaimer, the term of this patent is extended or adjusted under 35 U.S.C. 154(b) by 678 days.

(21) Appl. No.: 13/639,491

(22) PCT Filed: Mar. 31, 2011

(86) PCT No.: PCT/EP2011/001639
§ 371 (c)(1),
(2), (4) Date: Oct. 4, 2012

(87) PCT Pub. No.: WO2011/124352
PCT Pub. Date: Oct. 13, 2011

(65) Prior Publication Data
US 2013/0032729 A1     Feb. 7, 2013

Related U.S. Application Data

(60) Provisional application No. 61/342,256, filed on Apr. 9, 2010.

(51) Int. Cl.
*H01J 37/09* (2006.01)
*H01J 37/244* (2006.01)

(52) U.S. Cl.
CPC .............. *H01J 37/244* (2013.01); *H01J 37/09* (2013.01); *H01J 2237/0437* (2013.01); *H01J 2237/0453* (2013.01); *H01J 2237/2446* (2013.01);

(Continued)

(58) Field of Classification Search
CPC ................................. G01N 23/22; H01J 37/28
See application file for complete search history.

(56) References Cited

U.S. PATENT DOCUMENTS

| 5,892,224 A * | 4/1999 | Nakasuji ................... 250/310 |
| 6,646,262 B1 * | 11/2003 | Todokoro .............. H01J 37/244 850/9 |
| 2003/0168606 A1 | 9/2003 | Adamec et al. |

(Continued)

FOREIGN PATENT DOCUMENTS

| EP | 1150327 A1 | 10/2001 |
| EP | 1703537 B1 | 5/2008 |

(Continued)

OTHER PUBLICATIONS

International Search Report and Written Opinion of the International Searching Authority in International Application No. PCT/EP2011/001639, dated Jul. 20, 2011, 12 pages.

(Continued)

*Primary Examiner* — Casey Bryant
(74) *Attorney, Agent, or Firm* — Morris & Kamlay LLP

(57) ABSTRACT

A charged particle detection system comprises plural detection elements and a multi-aperture plate in proximity of the detection elements. Charged particle beamlets can traverse the apertures of the multi-aperture plate to be incident on the detection elements. More than one multi-aperture plate can be provided to form a stack of multi-aperture plates in proximity of the detector. A suitable electric potential supplied to the multi-aperture plate can have an energy filtering property for the plural charged particle beamlets traversing the apertures of the plate.

15 Claims, 3 Drawing Sheets

(52) U.S. Cl.
CPC .............. *H01J2237/24592* (2013.01); *H01J 2237/2817* (2013.01)

(56) References Cited

U.S. PATENT DOCUMENTS

| | | | |
|---|---|---|---|
| 2003/0209676 A1 | 11/2003 | Loschner et al. | |
| 2004/0075054 A1* | 4/2004 | Knippelmeyer | H01J 37/147 250/310 |
| 2009/0114818 A1 | 5/2009 | Casares et al. | |

FOREIGN PATENT DOCUMENTS

| | | |
|---|---|---|
| TW | 200634884 A | 10/2006 |
| WO | 2005024881 A2 | 3/2005 |
| WO | 2007028595 A2 | 3/2007 |
| WO | 2007028596 A1 | 3/2007 |
| WO | 2007060017 A2 | 5/2007 |

OTHER PUBLICATIONS

First Office Action, issued Feb. 2, 2015 in corresponding Chinese Application No. 201180028500.0.

* cited by examiner

CHARGED PARTICLE DETECTION SYSTEM AND MULTI-BEAMLET INSPECTION SYSTEM

BACKGROUND OF THE INVENTION

1. Field of the Invention

The present invention relates to charged particle detection and inspection systems, and the invention in particular relates to such systems using multiple beamlets of charged particles.

2. Brief Description of Related Art

A conventional multi-beamlet inspection system is known from WO 2005/024881. The multi-beamlet inspection system disclosed therein is used for inspecting an object, such as a semiconductor wafer. A plurality of primary electron beamlets is focussed in parallel to each other to form an array of primary electron beam spots on the object. Secondary electrons generated from the primary electrons and emanating from respective primary electron beam spots are received by a charged particle imaging optics to form a corresponding array of secondary electron beamlets which are supplied to an electron detection system having an array of detection elements such that each secondary electron beamlet is incident on a separate detection element. Detection signals generated from the detection elements are indicative of properties of the object at those locations where the primary electron beam spots are formed.

By scanning the array of primary electron beam spots across the surface of the object, it is possible to obtain an electron microscopic image of the object. It is desirable to obtain images of a great number of objects per time such that a high throughput can be achieved. For this purpose it is desirable to obtain electron optical images of the inspected surface having a high contrast.

Conventional electron inspection systems using a single primary electron beam, such as scanning electron microscopes (SEMS) use energy filters for increasing image contrast. The energy filter allows secondary electrons exceeding a threshold energy to traverse the filter and to be incident on a detector, whereas secondary electrons having a kinetic energy below the threshold energy are rejected and not allowed to be incident on the detector. Such conventional energy filters used in scanning electron microscopes may comprise a grid electrode disposed in the secondary electron beam path between the surface of the object and an objective lens receiving the electron beam.

It is desirable to have the feature of energy filtering also available in charged particle systems using an array of multiple charged particle beamlets.

SUMMARY OF THE INVENTION

The present invention has been accomplished taking the above problems into consideration.

Embodiments of the present invention provide a charged particle detection system comprising a detector having an array of plural detection elements for detecting charged particles and having an energy filtering property.

Other embodiments of the present invention provide a charged particle detection system comprising a detector having an array of plural detection elements for detecting charged particles and a property for reducing cross talk between charged particle beamlets incident on the detection elements.

According to an exemplary embodiment of the invention, the charged particle detection system comprises a detector having an array of plural detection elements and a first aperture plate having a first array of plural apertures to be traversed by charged particle beamlets, wherein the first aperture plate is disposed at a first distance from the detector. The charged particle detection system further comprises a voltage supply for supplying electric potentials to the first detector and the first aperture plate, and the apertures of the first aperture plate and the detection elements of the first detector are aligned relative to each other such that plural beamlets of charged particles can each traverse an aperture of the first aperture plate to be incident on a detection element of the first detector. The electric potentials supplied to the first detector and the first aperture plate can be provided such that only charged particles of a beamlet having a kinetic energy greater than a threshold energy can traverse the respective aperture of the first aperture plate to be incident on the respective detection element. The other charged particles having a kinetic energy below the threshold energy are then not able to traverse the aperture, and they are not able to be incident on the detection element, accordingly.

According to a particular embodiment herein, the charged particle detection system further comprises a second aperture plate having a second array of plural apertures to be traversed by the charged particle and disposed at a second distance from the detector which is greater than the first distance. The voltage supply is configured to supply an electric potential also to the second aperture plate.

Moreover, the voltages can be supplied such that the first and second aperture plates provide a focussing effect on each of the plurality of the charged particle beamlets traversing the aperture plates such that a cross section of each of the beamlets is reducing with decreasing distance from the detection element. This will reduce a probability for existence of charged particle trajectories which traverse a given aperture of the first aperture plate and are then incident on a detection element adjacent to the one detection element associated with the given aperture which was traversed.

According to some embodiments, a value of the first distance can be within an exemplary range from 6 mm to 20 mm. According to some embodiments herein, values of the second distance can be within an exemplary range from 10 mm to 30 mm. According to some other embodiments herein, values of the second distance can be greater than the values of the first distance by an amount within an exemplary range from 2 mm to 20 mm.

According to exemplary embodiments using negative particles, such as electrons or negatively charged ions, as the charged particles, the voltage supply is configured to apply a first electric potential to the first detector which is, relative to a reference potential, greater than a second electric potential applied to the first aperture plate. With such configuration it is possible that the charged particles having a kinetic energy lower than the threshold energy do not traverse the apertures of the first aperture plate whereas the charged particles having a kinetic energy greater than the threshold energy can traverse the apertures of the first aperture plate and get accelerated towards the detector to be incident on respective detection elements. In embodiments using positive particles, such as positively charged ions, as the charged particles, the first electric potential can be smaller than the second electric potential.

In embodiments having the second aperture plate, the voltage supply can be configured to apply a third electric potential to the second aperture plate, which is, relative to the reference potential, greater than the second electric potential applied to the first aperture plate. With such arrangement it is possible to obtain a focussing of a charged particle beamlet traversing an aperture of the second aperture plate towards a corresponding aperture of the first aperture plate such that an accuracy of the energy filtering property as well as prevention of cross talk are improved.

According to further exemplary embodiments, the charged particle detection system comprises a third aperture plate having an array of plural apertures disposed in-between the first detector and the first aperture plate, wherein the voltage supply is further configured to apply a fourth electric potential to the third aperture plate. According to exemplary embodiments herein, the fourth electric potential can be in-between the electric potentials applied to the first detector and the first aperture plate. Such arrangement can be helpful in further improving the energy filtering property and in prevention of cross talk between adjacent elements.

According to further exemplary embodiments, the charged particle detection system comprises a fourth aperture plate having an array of plural apertures disposed in-between the first aperture plate and the second aperture plate, wherein the voltage supply is further configured to apply a fifth electric potential to the fourth aperture plate. According to particular embodiments herein, the fifth electric potential can have a value in-between a value of the electric potential applied to the first aperture plate and a value of the electric potential applied to the second aperture plate. Such arrangement can be advantageous with respect to focussing a charged particle beamlet towards a respective aperture of the first aperture plate in view of improving an energy filtering property.

According to further exemplary embodiments, the charged particle detection system comprises at least one charged particle lens disposed at a distance from the detector which is greater than a distance of the first aperture plate or, in embodiments having the second aperture plate, is greater than a distance of the second aperture plate from the detector. The at least one charged particle lens is configured to receive plural charged particle beamlets and to direct the plural charged particle beamlets towards the first and second, respectively, aperture plates such that each charged particle beamlet traverses a respective corresponding aperture of the aperture plate. The at least one charged particle lens may comprise an electrostatic lens providing an electrostatic field and a magnetic lens providing a magnetic field and a combination thereof providing both an electrostatic field and a magnetic field. According to embodiments therein, the at least one charged particle lens has a bore which is commonly traversed by the plurality of charged particle beamlets.

According to further embodiments, the charged particle detection system comprises a beam splitter configured to separate trajectories of the charged particle beamlets directed towards the first detector from trajectories of charged particles contained in those beamlets and rejected by the energy filtering property of the first multi-aperture plate or combination of first, second, third and fourth aperture plates in those embodiments where these are available.

In a particular embodiment herein, the charged particle detection system further comprises a second detector disposed such that charged particles rejected by the energy filtering property are incident on the second detector to generate a corresponding detection signal. Such arrangement allows to determine a number or proportion of charged particles contained in the charged particle beamlets directed to the aperture plate having a kinetic energy below the threshold energy determined by the electric potentials applied to the one or more aperture plates and the detector. According to particular embodiments herein, the second detector may comprise a plurality of detection elements. The number of detection elements of the second detector can be less than the number of detection elements of the first detector, and it is also possible that the first and second detectors have a same number of detection elements.

According to other exemplary embodiments of the present invention, a multi-beamlet inspection system for inspecting a substrate is provided, wherein the system comprises: a charged particle detection system; a charged particle source for generating a first array of charged particle beamlets; first beam shaping optics for directing the array of charged particle beamlets onto the substrate to form an array of spots illuminated with charged particles on the substrate; and second beam shaping optics for receiving charged particles emanating from the substrate and directing the received charged particles as a second array of charged particle beamlets towards the charged particle detection system; wherein the charged particle detection system comprises: a first detector having an array of plural detection elements for detecting charged particles; a first aperture plate having a first array of plural apertures to be traversed by charged particles and disposed at a first distance from the first detector; a second aperture plate having a second array of plural apertures to be traversed by charged particles and disposed at a second distance from the first detector, the second distance being greater than the first distance; and a voltage supply for supplying electric potentials to the first detector, the first aperture plate and the second aperture plate; wherein the apertures of the first aperture plate, the apertures of the second aperture plate and the detection elements of the first detector are aligned relative to each other such that plural beamlets of charged particles can each traverse an aperture of the first aperture plate and an aperture of the second aperture plate to be incident on a detection element of the first detector.

BRIEF DESCRIPTION OF THE DRAWINGS

The forgoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
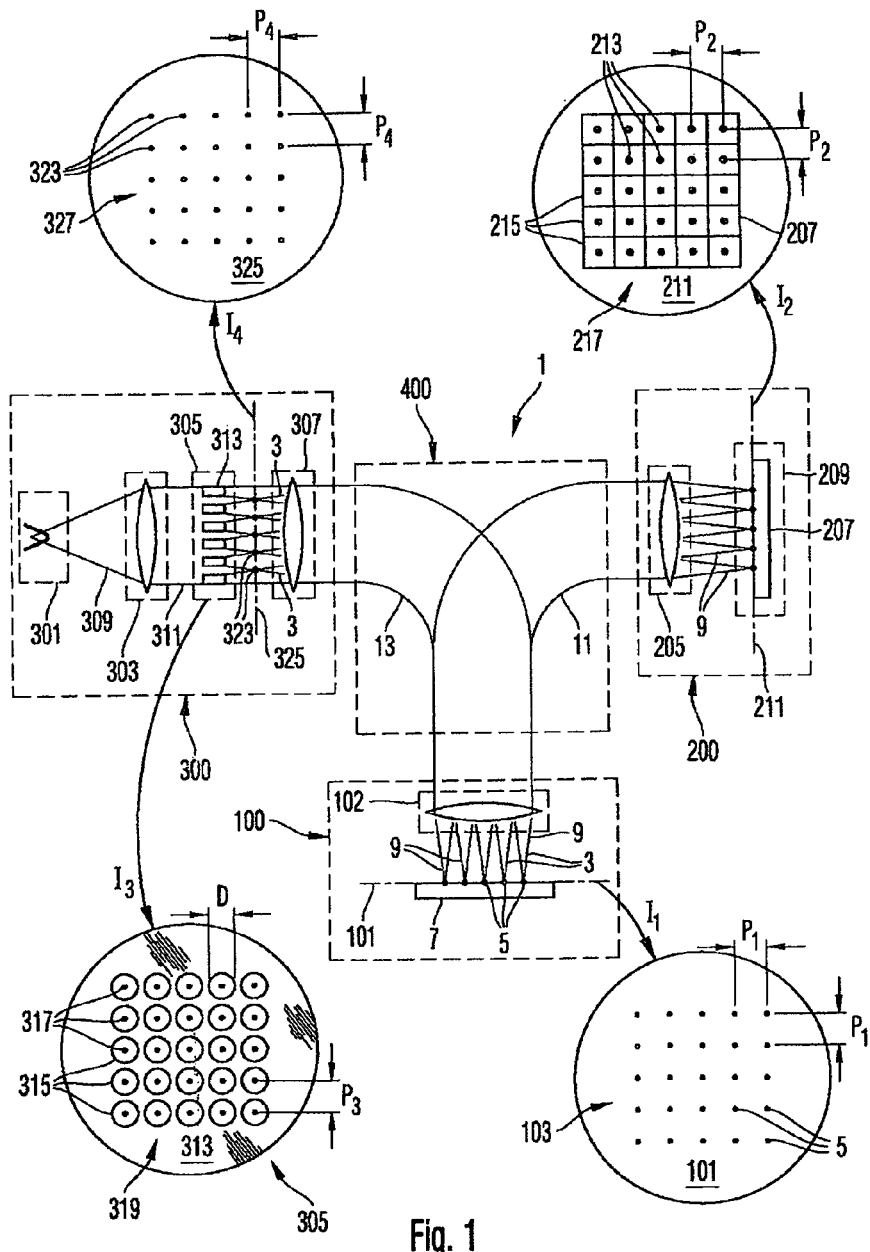
FIG. 1 schematically illustrates basic features and functions of a multi-beamlet inspection system according to an embodiment of the present invention.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 is a schematic diagram symbolically illustrating basic functions and features of a multi-beamlet inspection system. The inspection system generates a plurality of primary electron beamlets which are incident on a substrate to be inspected to produce secondary electrons emanating from the surface which are subsequently detected. While the illustrated embodiment uses electrons as primary particles incident on the substrate and as secondary particles released from the substrate, it is also possible to use other sorts of energy, such as beamlets of incident light, and beamlets of other charged particles such as protons and helium ions to produce secondary charged particles which are subsequently detected. Also the secondary charged particles can be different from electrons.

The multi-beamlet electron inspection system 1 is of a scanning electron microscope type (SEM) using a plurality of primary electron beamlets 3 for generating primary electron beam spots 5 on a surface of the substrate 7 to be inspected. The inspected substrate 7 can be of any type and may comprise, for example, a semiconductor wafer and a biological sample and arrangement of miniaturized features of other types. The surface of the substrate 7 is arranged in an object plane 101 of an objective lens 102 of an objective lens system 100.

Insert $I_1$ of FIG. 1 shows an elevational view of object plane 101 with a regular rectangular array 103 of primary electron beam spots 5 formed thereon. In FIG. 1 a number of 25 primary electron beam spots are arranged as a 5×5-array 103. This number of 25 primary electron beam spots is a low number chosen for ease of illustration in the schematic diagram of FIG. 1. In practise, the number of primary electron beam spots may be chosen substantially higher, such as 30×50, 100×100 and others.

In the illustrated embodiment, the array 103 of primary electron beam spots 5 is a substantially regular rectangular array with a substantially constant pitch $p_1$ between adjacent beam spots. Exemplary values of $p_1$ are 1 µm and 10 µm. It is however also possible that the array 103 is a distorted regular array having different pitches in different directions, and the array may also have other symmetries, such as a hexagonal symmetry.

A diameter of the primary electron beam spots formed in the object plane 101 can be small. Exemplary values of such diameter are 5 nm, 100 nm and 200 nm. The focussing of the primary electron beamlets 3 to form the primary electron beam spots 5 is performed by the objective lens system 100.

The primary electrons incident on the substrate 7 at the beam spots 5 produce secondary electrons emanating from the surface of the substrate 7. The secondary electrons emanating from the surface of the substrate 7 are received by the objective lens 102 to form secondary electron beamlets 9. The inspection system 1 provides a secondary electron beam path 11 for supplying the plurality of secondary electron beamlets 9 to a charged particle detection system 200. The detection system 200 comprises a projection lens arrangement 205 for directing the secondary electron beamlets 9 towards a detector 207. The detector is a detector having plural detection elements and may comprise a CCD detector, a CMOS detector, a scintillator detector, a micro-channel plate, an array of PIN-diodes and others and suitable combinations thereof.

Insert $I_2$ of FIG. 1 shows an elevational view of the detector 207, wherein secondary electron beam spots 213 are formed on individual detection elements 215 which are arranged as an array 217 having a regular pitch $p_2$. Exemplary values of the pitch $p_2$ are 10 µm, 100 µm and 200 µm.

The primary electron beamlets 3 are generated by a beamlet generation system 300 comprising at least one electron source 301, at least one collimating lens 303, a multi-aperture plate arrangement 305 and a field lens 307.

The electron source 301 generates a diverging electron beam 309 which is collimated by collimating lens 303 to form a beam 311 illuminating the multi-aperture arrangement 305.

Insert $I_3$ of FIG. 1 shows an elevational view of the multi-aperture arrangement 305. The multi-aperture arrangement 305 comprises a multi-aperture plate 313 having a plurality of apertures 315 formed therein. Centers 317 of the apertures 315 are arranged in a pattern 319 corresponding to the pattern 103 of the primary electron beam spots 5 formed in the object plane 101. A pitch $p_3$ of array 103 may have exemplary values of 5 µm, 100 µm and 200 µm. Diameters D of the apertures 315 are less than the pitch $p_3$. Exemplary values of the diameters D are $0.2 \cdot p_3$, $0.4 \cdot p_3$ and $0.8 \cdot p_3$.

Electrons of the illuminating beam 311 traversing the apertures 315 form the primary electron beamlets 3. Electrons of illuminating beam 311 impinging on the plate 313 are intercepted by the plate and do not contribute to forming the primary electron beamlets 3.

Moreover, the multi-aperture arrangement 305 focuses the individual electron beamlets 3 such that foci 323 are generated in a plane 325. Insert $I_4$ of FIG. 1 shows an elevational view of plane 325 with foci 323 arranged in a pattern 327. A pitch $p_4$ of pattern 327 may be equal to or different from the pitch $p_3$ of pattern 319 of the multi-aperture plate 313. A diameter of foci 323 may have exemplary values of 10 nm, 100 nm and 1 µm.

The field lens 307 and the objective lens 102 provide an imaging system for imaging the plane 325 onto the object plane 101 to form the array 103 of primary electron beam spots 5 on the surface of the substrate 7.

A beam splitter system 400 is provided in the primary electron beam path 313 in-between the beam generating system 300 and the objective lens system 100. The beam splitter system 400 is also part of the secondary electron beam path 11 such that the beam splitter system 400 is located in-between the objective lens system 100 and the detection system 200.

Background information relating to such beamlet inspection system and charged particle components used therein, such as charged particle sources, multi-aperture plates and lenses may be obtained from WO 2005/024881, WO 2007/028595, WO 2007/028596 and WO 2007/060017 by the same assignees wherein the full disclosure of these applications is incorporated herein by reference.

Figure 2:
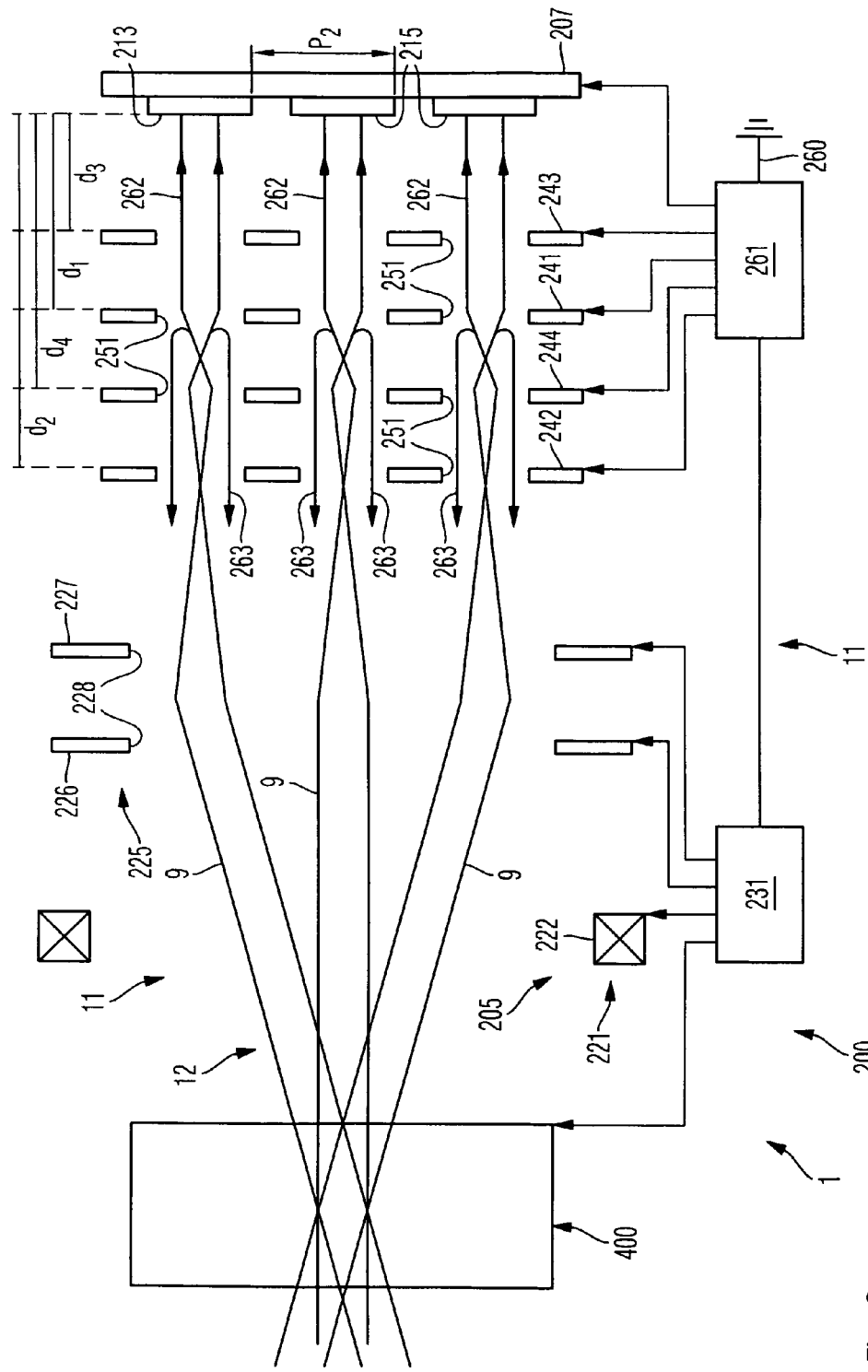
FIG. 2 schematically illustrates a charged particle detection system according to an embodiment of the present invention and contained in the inspection system shown in FIG. 1.

FIG. 2 is a more detailed schematic illustration of the charged particle detection system 200 of the multi-beamlet inspection system 1. FIG. 2 shows a charged particle beamlet bundle 12 having an exemplary low number of three secondary electron beamlets 9. This low number of secondary electron beamlets 9 was chosen for illustration purposes only, and this number can be significantly higher in practise as already illustrated as above.

A bundle 12 of secondary electron beamlets 9 is supplied to the detection system 200 from the beam splitting system 400. The projection lens system 205 receiving the beamlets 9 from the beam splitter is shown in this embodiment to comprise a magnetic lens 221 having a coil 222 for generating a magnetic field, and an electrostatic lens 225 having two plate electrodes 226 and 227. The plate electrodes 226, 227 each have a circular aperture 228 which is commonly traversed by all beamlets 9 of the bundle 12.

The projection lens arrangement 205 shapes the whole bundle 12 of beamlets 9 and the individual beamlets 9 such that they traverse the respective apertures 251 and are directed towards the detection elements 215 of the detector 207.

A control portion 231 of a control system of the multi-beamlet inspection system is provided for supplying a suitable excitation current to the coil 222 and suitable electric potentials to the plate electrodes 226 and 227. The control portion 231 may also supply suitable control signals such as currents and electric potentials to the beam splitting system 400.

A plurality of multi-aperture plates 241, 242, 243 and 244 are disposed in the secondary electron beam path 11 upstream of the detector 207. The multi-aperture plates 241 to 244 are spaced apart from each other and from the detector 207. In particular, multi-aperture plate 241 has a distance $d_1$ from a surface of the detection elements 213, wherein $d_1$ has exemplary values of from 6 mm to 20 mm. Multi-aperture plate 242 is disposed at a distance $d_2$ from the surfaces of the detection elements 213, wherein $d_2$ may have exemplary values from 10 mm to 30 mm, such that $d_2$ is greater than $d_1$ by an amount of 2 mm to 20 mm.

Multi-aperture plate 243 is disposed in-between multi-aperture plate 241 and the detector 207 at a distance $d_3$ therefrom. Exemplary values of a difference $d_1-d_3$ can be from 1 mm to 5 mm.

Multi-aperture plate 244 is disposed in-between multi-aperture plate 242 and multi-aperture plate 241 at a distance $d_4$ from the surfaces of detection elements 213.

Each of the multi-aperture plates 241 to 244 has an array of plural apertures 251 which are arranged such that they are traversed by the secondary electron beamlets 9 on their way between the projection lens arrangement 205 and the detection elements 213. One aperture 251 of a plate is traversed by one beamlet 9, and different beamlets 9 traverse different apertures 251 of each plate.

In the illustration of FIG. 2, the beamlets are shown to be orthogonally incident on the detector, and the multi-aperture plates 241 to 244 are shown to have identically aligned apertures 251 of equal shape. It is, however, possible that the apertures 251 of different multi-aperture plates are somewhat displaced relative to each other for manipulating the beamlets traversing the apertures in certain ways, and it is also possible that the beamlets are not orthogonally incident on the detector 207. Moreover, it is possible that a direction of incidence on the detector of individual beamlets may vary across the beamlet bundle, and that a displacement of apertures of one plate relative to corresponding apertures of another plate varies across the array of apertures of the one plate. Still further, the multi-aperture plates shown in the illustration have surfaces which are parallel to each other. It is, however, also possible that one or more of the plates have one or two curved surfaces, and it is also possible to tilt one or more of the plates relative to the detector. Further, it is possible that the apertures of different aperture plates have different diameters. For example, an aperture plate closer to the detector may have apertures of a greater diameter than an aperture plate farther away from the detector. Still further, different aperture plates may have different thicknesses such that, for example, an aperture plate closer to the detector has a greater thickness than an aperture plate farther away from the detector. Background information on the effects of variations of aperture locations and surface curvatures of multi-aperture plates can be taken from WO 2005/024881, WO 2007/028595 and WO 2007/028596.

A voltage supply 261 which can be a portion of a control system of the multi-beamlet inspection system 1 is provided to supply electrical potentials relative to a reference potential 260, which is ground potential in this embodiment, to the detector 207 and the multi-aperture plates 241 to 244. The electric potentials supplied to the multi-aperture plates influence trajectories of charged particles within the individual beamlets 9 as well as the kinetic energies of those particles. In the embodiment shown in FIG. 2, the electric potentials are supplied to the multi-aperture plates such that electrons 262 having a kinetic energy above a given threshold can traverse the apertures 251 of multi-aperture plate 241 and, subsequently, the apertures 251 of multi-aperture plate 243 to be incident on the detection elements 215. Electrons having a kinetic energy below the given threshold can not traverse the apertures 251 of multi-aperture plate 241 and are reflected from multi-aperture plate 241. The reflected electrons can be incident on the multi-aperture plate 244, and they can be directed such that they traverse the apertures 251 of one or both of multi-aperture plates 244 and, subsequently, 242 as illustrated by arrows 263.

The multi-aperture plate 241 has a function of an energy filter, accordingly.

The multi-aperture plates 242 and 244 have a function of adjusting the kinetic energies and directions of the electrons within beamlets 9 such that the energy filter has a high performance of selecting the electrons capable of reaching the detection elements. It is of course desirable that all electrons having a kinetic energy equal to or greater than the threshold energy are allowed to reach the detection elements wherein all other electrons are rejected. In practise, however, such exact step function of transmission in dependence of kinetic energy is not achievable since the electrons within the beams travel under a plurality of angles relative to a main axis of the beamlet 9 such that also electrons having a kinetic energy higher than the threshold but travelling under an angle relative to the beamlet axis get rejected.

In the embodiment shown in FIG. 2, the multi-aperture plates 242 and 244 perform a function of improving directions of incidence of the electrons relative to a plane of the multi-aperture plate 241 and of manipulating the beamlets such that they maintain a relatively low diameter. For this purpose, the multi-aperture plates 242, 244 and 241 perform a function of electrostatic lenses which can be seen in the schematic representation of FIG. 2 from the varying diameter of the beamlets 9 between the plates, and, in particular, the formation of a cross over within the beamlets with the multi-aperture plates 244 and 241.

The multi-aperture plate 243 has a function of forming an electrostatic lens together with multi-aperture plate 241 to accelerate and focus the beamlets having traversed the multi-aperture plate 241 towards the detection elements 251.

While the above illustrated embodiment comprises four multi-aperture plates disposed upstream of the detector and at a close distance from each other, it is also possible that other embodiments comprise only one or two or three multi-aperture plates or more than four aperture plates such as five or six or more aperture plates in proximity of the detector.

Distances of multi-aperture plates from a detector and electric potentials applied to these multi-aperture plates of an exemplary embodiment having four multi-aperture plates and using electrons as the charged particles are listed in table 1 below.

TABLE 1

|  | detector | plate #1 | plate #2 | plate #3 | plate #4 |
|---|---|---|---|---|---|
| Distance [mm] | 0 | 12 | 14 | 16 | 19 |
| Voltage [V] | 60,000 | 1,500 | −10 | 1,500 | 9,000 |

Distances of multi-aperture plates from a detector and electric potentials applied to these multi-aperture plates of a further exemplary embodiment having four multi-aperture plates are and using electrons as the charged particles listed in table 2 below.

TABLE 2

|  | detector | plate #1 | plate #2 | plate #3 | plate #4 | plate #5 |
|---|---|---|---|---|---|---|
| Distance [mm] | 0 | 9 | 12 | 14 | 16 | 19 |
| Voltage [V] | 30,000 | 13,900 | 1,400 | −10 | 1,000 | 10,000 |

In the embodiment shown in FIG. 2, only the secondary electrons having a kinetic energy above the given threshold are detected by detector 207. The rejected secondary electrons having a kinetic energy below the threshold can be absorbed by multi-aperture plates 244 or 242, or they can leave the stack of multi-aperture plates 241, 242, 243 and 244 to travel in a direction towards the beam splitting system 400. In practise, those electrons will be incident on some mounting structure or vacuum vessel of the multi-beamlet inspection system. However, the inventor found it desirable to also detect the electrons having the kinetic energy below the threshold since also these electrons carry some information on the inspected object. The embodiment shown in FIG. 3 provides a solution to this.

Figure 3:
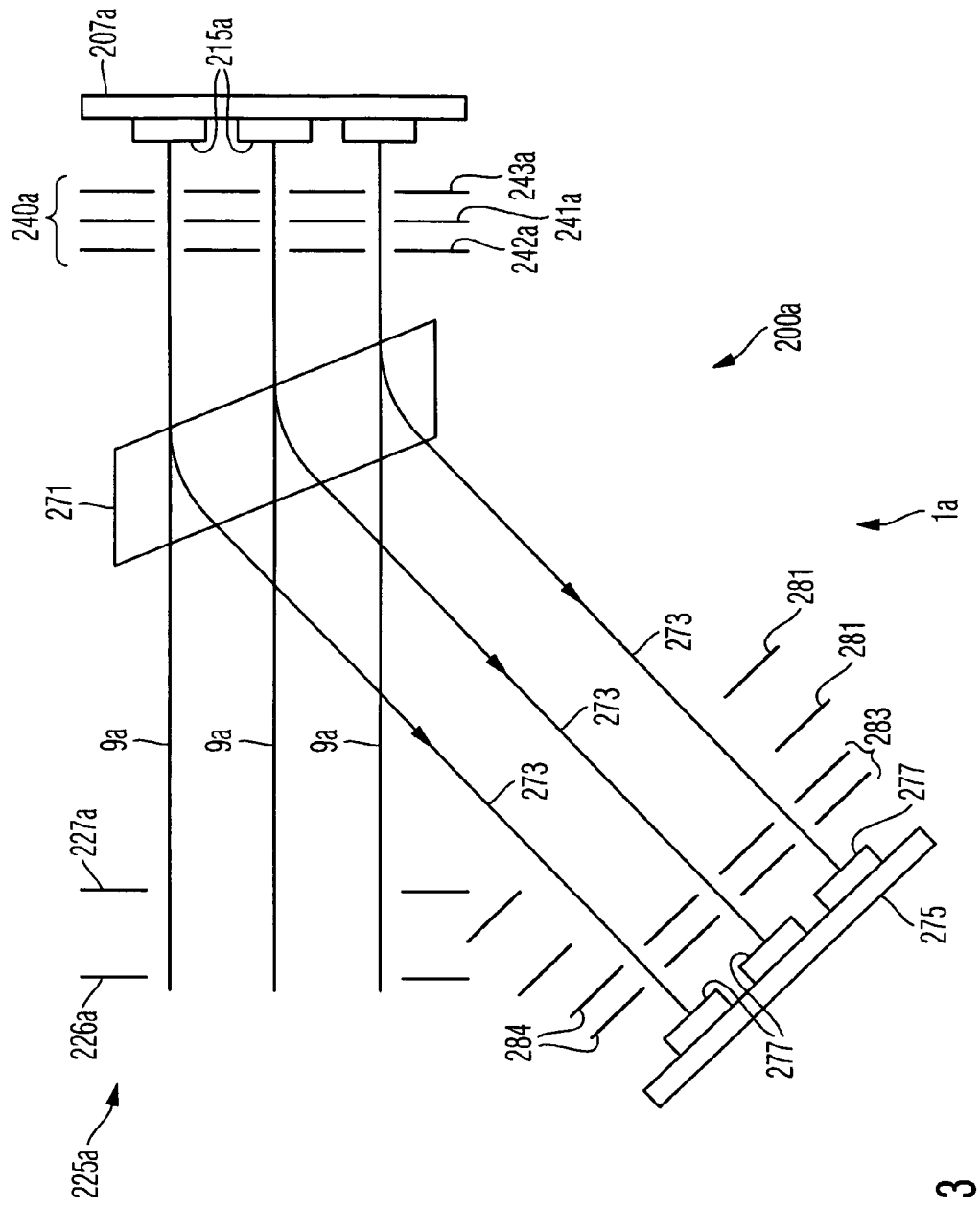
FIG. 3 schematically shows a charged particle detection system according to a further embodiment of the present invention.

FIG. 3 shows a detection system 200a of a multi-beamlet inspection system 1a which can have a similar configuration as that shown in FIG. 1. The detection system 200a has a similar configuration as the detection system shown in FIG. 2 in that a stack 240a of plural multi-aperture plates 241a, 242a and 243a is disposed in a beam path of secondary electron beamlets 9a between a projection lens arrangement 225a and a detector 207a having plural detection elements 215a. The stack 240a of multi-aperture plates 241a, 242a, 243a performs a function of an energy filter such that that electrons of the beamlets 9a having a kinetic energy greater than a threshold are allowed to be incident on the detection elements 215a, whereas electrons having a lower kinetic energy are rejected. A portion of those rejected electrons travels back towards the projection lens arrangement 225a. The detection system 200a shown in FIG. 3 differs from the detection system shown in FIG. 2 in that a beam splitter 271 is disposed in a beam path between the projection lens arrangement 225a and the stack 240a of multi-aperture plates. In the shown embodiment the beam splitter 271 is configured such that the secondary electron beamlets 9a can traverse the beam splitter 271 along a substantially un-deflected straight line whereas trajectories of beamlets 273 of electrons having the energy lower than the threshold are deflected by a predetermined angle to be incident on detection elements 277 of a detector 275. The beam splitter 271 can be embodied as a space in which orthogonal magnetic and electric fields are provided such that charged particles travelling in one direction are transmitted along a straight line whereas charged particles travelling in the opposite direction are deflected by a given angle. In other embodiments, the beam splitter can be configured such that both the secondary electron beamlets 9a and the beamlets 273 are deflected by given angles such that none of the beamlets necessarily travel along straight lines.

For improving the kinetic energy at which the particles of beamlets 273 are incident on the detection elements 277 and to avoid cross talk between adjacent detection elements 277, additional beamlet manipulating elements can be disposed in the beam path of beamlets 273. FIG. 3 schematically illustrates two plate electrodes 281 providing a global lens effect to all beamlets 273. Further, FIG. 3 schematically indicates a stack 283 of multi-aperture plates 284 disposed in proximity of the detector 275 and each having a plurality of apertures corresponding in position to positions of the detection elements 277 such that beamlets 273 of secondary electrons having energies below the threshold can be incident on corresponding detection elements 277.

Summarized, embodiments of the present invention comprise a charged particle detection system with plural detection elements and a multi-aperture plate in proximity of the detection elements. Charged particle beamlets can traverse the apertures of the multi-aperture plate to be incident on the detection elements. More than one multi-aperture plate can be provided to form a stack of multi-aperture plates in proximity of the detector. A suitable electric potential supplied to the multi-aperture plate can have an energy filtering property for the plural charged particle beamlets traversing the apertures of the plate.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

The invention claimed is:

1. A charged particle detection system, comprising:
    a first detector having an array of plural detection elements for detecting charged particles;
    a first aperture plate having a first array of plural apertures to be traversed by charged particles and disposed at a first distance from the first detector;
    a second aperture plate having a second array of plural apertures to be traversed by charged particles and disposed at a second distance from the first detector, the second distance being greater than the first distance; and
    a voltage supply configured to supply a first electric potential to the first detector, to supply a second electric potential to the first aperture plate, and to supply a third electric potential to the second aperture plate;
    wherein the apertures of the first aperture plate, the apertures of the second aperture plate and the detection elements of the first detector are substantially aligned relative to each other such that plural beamlets of charged particles can each traverse an aperture of the first aperture plate and an aperture of the second aperture plate to be incident on a detection element of the first detector; and
    wherein the first electric potential, the second electric potential and the third electric potential are selected so that charged particles of the beamlets having a kinetic energy below a threshold energy cannot traverse the first array of plural apertures of the first aperture plate and are prevented from being incident on the detection elements.

2. The charged particle detection system according to claim 1, wherein the first distance is greater than 50 times a minimum distance between adjacent detection elements.

3. The charged particle detection system according to claim 1, wherein the first distance is less than 1000 times the minimum distance between adjacent detection elements.

4. The charged particle detection system according to claim 1, wherein the second distance is greater than 1.5 times the first distance.

5. The charged particle detection system according to claim 1, wherein the second distance is less than 5 times the first distance.

6. The charged particle detection system according to claim 1, wherein the first and second electric potentials are measured relative to a same reference potential, and wherein the first electric potential has an absolute value which is greater than an absolute value of the second electric potential.

7. The charged particle detection system according to claim 6, wherein the third electric potential is, relative to the reference potential, less than the second electric potential supplied to the first aperture plate.

8. The charged particle detection system according to claim 1, further comprising a third aperture plate having an array of plural apertures and disposed at a third distance from the first detector which is less than the first distance, wherein the apertures of the third aperture plate are aligned relative to the apertures of the first aperture plate such that the each of the plural beamlets of charged particles can traverse an aperture of the third aperture plate.

9. The charged particle detection system according to claim 8, wherein the voltage supply is configured to supply a fourth electric potential to the third aperture plate which is in between the electric potentials supplied to the first detector and the first aperture plate.

10. The charged particle detection system according to claim 1, further comprising a fourth aperture plate having an array of plural apertures and disposed at a fourth distance from the first detector which is greater than the first distance and less than the second distance, wherein the apertures of the fourth aperture plate are aligned relative to the apertures of the first aperture plate such that the each of the plural beamlets of charged particles can traverse an aperture of the fourth aperture plate.

11. The charged particle detection system according to claim 10, wherein the voltage supply is configured to supply a fifth electric potential to the fourth aperture plate which is in between the electric potentials supplied to the first aperture plate and the second aperture plate.

12. The charged particle detection system according to claim 1, further comprising at least one charged particle lens provided by at least one of an electrostatic field and a magnetic field and disposed at a fifth distance from the first detector which is greater than the second distance, wherein the at least one charged particle lens is commonly traversed by the plural beamlets of charged particles.

13. The charged particle detection system according to claim 1, further comprising at least one charged particle beam splitter disposed at a sixth distance from the first detector which is greater than the second distance, wherein the charged particle beam splitter is configured and arranged to direct charged particles prevented from being incident on the detection elements onto a second detector for detecting charged particles.

14. The charged particle detection system according to claim 13, wherein the second detector has a plurality of detection elements.

15. A multi-beamlet inspection system for inspecting a substrate, comprising:
    a charged particle detection system;
    a charged particle source for generating a first array of charged particle beamlets;
    first beam shaping optics for directing the array of charged particle beamlets onto the substrate to form an array of spots illuminated with charged particles on the substrate; and
    second beam shaping optics for receiving charged particles emanating from the substrate and directing the received charged particles as a second array of charged particle beamlets towards the charged particle detection system;
    wherein the charged particle detection system comprises:
    a first detector having an array of plural detection elements for detecting charged particles;
    a first aperture plate having a first array of plural apertures to be traversed by charged particles and disposed at a first distance from the first detector;
    a second aperture plate having a second array of plural apertures to be traversed by charged particles and disposed at a second distance from the first detector, the second distance being greater than the first distance; and
    a voltage supply configured to supply a first electric potential to the first detector, to supply a second electric potential to the first aperture plate, and to supply a third electric potential to the second aperture plate;
    wherein the apertures of the first aperture plate, the apertures of the second aperture plate and the detection elements of the first detector are substantially aligned relative to each other such that plural beamlets of charged particles can each traverse an aperture of the first aperture plate and an aperture of the second aperture plate to be incident on a detection element of the first detector; and
    wherein the first electric potential, the second electric potential and the third electric potential are selected so that charged particles of the beamlets having a kinetic energy below a threshold energy cannot traverse the first array of plural apertures of the first aperture plate and are prevented from being incident on the detection elements.

\* \* \* \* \*